United States Patent
Yin et al.

(10) Patent No.: US 11,569,407 B2
(45) Date of Patent: Jan. 31, 2023

(54) DISPLAY PANEL, LIGHT-EMITTING DEVICE, AND DRIVING METHOD THEREOF

(71) Applicant: Shenzhen China Star Optoelectronics Semiconductor Display Technology Co., Ltd., Shenzhen (CN)

(72) Inventors: Yongming Yin, Shenzhen (CN); Chiayu Lee, Shenzhen (CN); Chunche Hsu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/488,621

(22) PCT Filed: Jun. 10, 2019

(86) PCT No.: PCT/CN2019/090496
§ 371 (c)(1),
(2) Date: Aug. 26, 2019

(87) PCT Pub. No.: WO2020/232763
PCT Pub. Date: Nov. 26, 2020

(65) Prior Publication Data
US 2022/0115555 A1 Apr. 14, 2022

(30) Foreign Application Priority Data
May 23, 2019 (CN) .......................... 201910435208.9

(51) Int. Cl.
*H01L 33/00* (2010.01)
*G09G 3/20* (2006.01)
(Continued)

(52) U.S. Cl.
CPC ....... *H01L 33/0004* (2013.01); *G09G 3/2007* (2013.01); *G09G 3/34* (2013.01);
(Continued)

(58) Field of Classification Search
CPC ............... H01L 25/048; H01L 27/3202; H01L 27/3209; H01L 51/504; H01L 51/5044;
(Continued)

(56) References Cited

U.S. PATENT DOCUMENTS

2010/0314636 A1* 12/2010 Matsunami ......... H01L 51/5278
257/E33.068
2011/0068330 A1 3/2011 Akimoto et al.
(Continued)

FOREIGN PATENT DOCUMENTS

CN 106972108 A * 7/2017
CN 106972108 A 7/2017
(Continued)

*Primary Examiner* — Priyank J Shah
(74) *Attorney, Agent, or Firm* — Nathan & Associates; Menachem Nathan

(57) ABSTRACT

A display panel, a light-emitting device, and a driving method thereof are provided. The light-emitting device includes a substrate, and a first electrode, a first light-emitting unit, a connecting layer, a second light-emitting unit, and a second electrode stacked up sequentially on the substrate. Polarities of the first electrode and the second electrode are opposite and reverse periodically in order that the first light-emitting unit and the second light-emitting unit illuminate alternately.

16 Claims, 3 Drawing Sheets

(51) Int. Cl.
  *G09G 3/34*   (2006.01)
  *H01L 33/08*  (2010.01)
  *H01L 51/52*  (2006.01)
  *H01L 33/26*  (2010.01)

(52) U.S. Cl.
  CPC .......... *H01L 33/08* (2013.01); *H01L 51/5278* (2013.01); *G09G 2310/0254* (2013.01); *G09G 2310/08* (2013.01); *G09G 2320/045* (2013.01); *G09G 2320/048* (2013.01); *H01L 33/26* (2013.01)

(58) Field of Classification Search
  CPC .......... H01L 51/5278; H01L 2251/564; G09G 2310/0254
  See application file for complete search history.

(56) References Cited

U.S. PATENT DOCUMENTS

| | | | |
|---|---|---|---|
| 2013/0240847 A1* | 9/2013 | Zakhidov | H01L 51/5296 977/842 |
| 2018/0323241 A1 | 11/2018 | Yan et al. | |
| 2018/0331161 A1 | 11/2018 | Liao et al. | |
| 2019/0157597 A1 | 5/2019 | Liao et al. | |
| 2019/0172876 A1* | 6/2019 | Xia | H01L 51/5092 |
| 2021/0028365 A1* | 1/2021 | Tasaki | H01L 51/006 |
| 2021/0296618 A1* | 9/2021 | Levermore | C07F 7/24 |

FOREIGN PATENT DOCUMENTS

| | | | | |
|---|---|---|---|---|
| CN | 107134256 A | | 9/2017 | |
| CN | 107170779 A | | 9/2017 | |
| CN | 107611229 A | | 1/2018 | |
| CN | 107863445 A | * | 3/2018 | .......... G09G 3/3225 |
| CN | 107863445 A | | 3/2018 | |
| CN | 107958962 A | | 4/2018 | |
| JP | H0883686 A | | 3/1996 | |

* cited by examiner

DISPLAY PANEL, LIGHT-EMITTING DEVICE, AND DRIVING METHOD THEREOF

BACKGROUND OF DISCLOSURE

1. Field of Disclosure

The present disclosure relates to the field of display technology, and more particularly, to a display panel, a light-emitting device, and a driving method thereof.

2. Description of Related Art

A material of perovskite is a novel optoelectronic material. The material of perovskite is widely applied in fields such as photovoltaics, light emission, and so on due to its superior optoelectronic property.

In the field of light emission, a light-emitting device, based on the material of perovskite, includes an anode, a hole injection layer, a hole transport layer, an electron blocking layer, a light-emitting layer, a hole blocking layer, an electron transport layer, an electron injection layer, and a cathode stacked up sequentially. The material of perovskite is used in the light-emitting layer to illuminate dazzling fluorescence while being driven by currents.

However, under a conventional current driving mode, there exists a problem that, the material of perovskite in the light-emitting layer is resolved, in the light-emitting device based on the material of perovskite, thereby causing the light-emitting device to have a short lifetime.

SUMMARY

The object of the present disclosure is to provide a display panel, a light-emitting device, and a driving method thereof to avoid that a material of perovskite in a light-emitting device based on the material of perovskite is resolved, thereby prolonging the lifetime of the light-emitting device.

In order to solve the above problem, an embodiment of the present disclosure provides a light-emitting device, including a substrate, and a first electrode, a first light-emitting unit, a connecting layer, a second light-emitting unit, and a second electrode stacked up sequentially on the substrate; wherein polarities of the first electrode and the second electrode are opposite and reverse periodically in order that the first light-emitting unit and the second light-emitting unit illuminate alternately.

One of the first light-emitting unit and the second light-emitting unit is of a first structure including a hole injection layer, a hole transport layer, an electron blocking layer, a light-emitting layer, a hole blocking layer, an electron transport layer, and an electron injection layer stacked up from bottom to top. The other one of the first light-emitting unit and the second light-emitting unit is of a second structure including the electron injection layer, the electron transport layer, the hole blocking layer, the light-emitting layer, the electron blocking layer, the hole transport layer, and the hole injection layer stacked up from bottom to top.

The connecting layer includes at least one material selected from a group consisting of Li, Rb, Cs, Mg, and Ag when the first light-emitting unit is of the first structure and when the second light-emitting unit is of the second structure.

The connecting layer includes at least one material selected from a group consisting of $FeCl_3$, $F_4$-TCNQ, $WO_3$, $MoO_3$, and HAT-CN when the first light-emitting unit is of the second structure and when the second light-emitting unit is of the first structure.

The connecting layer is of a laminated structure, wherein the laminated structure includes a first negative doped layer, a first positive doped layer, and a second negative doped layer stacked up from bottom to top when the first light-emitting unit is of the first structure and when the second light-emitting unit is of the second structure, and wherein the laminated structure includes a second positive doped layer, a third negative doped layer, and a third positive doped layer stacked up from bottom to top when the first light-emitting unit is of the second structure and when the second light-emitting unit is of the first structure.

Materials of the first, second, and third positive doped layers include a hole transporting material doped with positive dope including at least one material selected from a group consisting of $FeCl_3$, $F_4$-TCNQ, $WO_3$, $MoO_3$, and HAT-CN. Materials of the first, second, and third negative doped layers include an electron transporting material doped with negative dope including at least one material selected from a group consisting of Li, Rb, Cs, Mg, and Ag.

A material of the light-emitting layer includes perovskite.

A thickness of the connecting layer is between 5 and 100 nm.

Switching frequencies of the polarities of the first electrode and the second electrode are 60 Hz.

In order to solve the above problem, an embodiment of the present disclosure further provides a method of driving a light-emitting device including a substrate, and a first electrode, a first light-emitting unit, a connecting layer, a second light-emitting unit, and a second electrode stacked up sequentially on the substrate, the method including: inputting a common voltage to one of the first electrode and the second electrode, and inputting a gray level voltage to the other one of the first electrode and the second electrode, wherein the common voltage and the gray level voltage are different in order that the first light-emitting unit or the second light-emitting unit illuminates; and measuring time and judging whether duration of measuring time reaches a predetermined periodic duration, and if the duration of measuring time does, acquiring the present gray level voltage, adjusting the present gray level voltage based on the common voltage, and returning to the step of measuring time after clearing the measured time to zero in order that the first light-emitting unit and the second light-emitting unit illuminate alternately.

The step of adjusting the present gray level voltage based on the common voltage includes acquiring a difference value by computing the difference between the present gray level voltage and the common voltage; acquiring a target gray level voltage by computing the difference between the common voltage and the difference value; and adjusting the present gray level voltage to the target gray level voltage.

In order to solve the above problem, an embodiment of the present disclosure further provides a display panel, including a light-emitting device including a substrate, and a first electrode, a first light-emitting unit, a connecting layer, a second light-emitting unit, and a second electrode stacked up sequentially on the substrate; wherein polarities of the first electrode and the second electrode are opposite and reverse periodically in order that the first light-emitting unit and the second light-emitting unit illuminate alternately.

One of the first light-emitting unit and the second light-emitting unit is of a first structure including a hole injection layer, a hole transport layer, an electron blocking layer, a light-emitting layer, a hole blocking layer, an electron transport layer, and an electron injection layer stacked up from bottom to top. The other one of the first light-emitting unit and the second light-emitting unit is of a second structure including the electron injection layer, the electron transport layer, the hole blocking layer, the light-emitting layer, the electron blocking layer, the hole transport layer, and the hole injection layer stacked up from bottom to top.

The connecting layer includes at least one material selected from a group consisting of Li, Rb, Cs, Mg, and Ag when the first light-emitting unit is of the first structure and when the second light-emitting unit is of the second structure.

The connecting layer includes at least one material selected from a group consisting of $FeCl_3$, $F_4$-TCNQ, $WO_3$, $MoO_3$, and HAT-CN when the first light-emitting unit is of the second structure and when the second light-emitting unit is of the first structure.

The connecting layer is of a laminated structure, wherein the laminated structure includes a first negative doped layer, a first positive doped layer, and a second negative doped layer stacked up from bottom to top when the first light-emitting unit is of the first structure and when the second light-emitting unit is of the second structure, and wherein the laminated structure includes a second positive doped layer, a third negative doped layer, and a third positive doped layer stacked up from bottom to top when the first light-emitting unit is of the second structure and when the second light-emitting unit is of the first structure.

Materials of the first, second, and third positive doped layers include a hole transporting material doped with positive dope including at least one material selected from a group consisting of $FeCl_3$, $F_4$-TCNQ, $WO_3$, $MoO_3$, and HAT-CN. Materials of the first, second, and third negative doped layers include an electron transporting material doped with negative dope including at least one material selected from a group consisting of Li, Rb, Cs, Mg, and Ag.

A material of the light-emitting layer includes perovskite.

A thickness of the connecting layer is between 5 and 100 nm.

Switching frequencies of the polarities of the first electrode and the second electrode are 60 Hz.

The beneficial effect of the present disclosure is that, compared with conventional technologies, the present disclosure provides a light-emitting device including a first electrode, a first light-emitting unit, a connecting layer, a second light-emitting unit, and a second electrode stacked up sequentially, wherein polarities of the first electrode and the second electrode are opposite and reverse periodically in order that the first light-emitting unit and the second light-emitting unit illuminate alternately, avoiding that a light-emitting material in the light-emitting device has been in a bias electric field with a direction, further avoiding that a material of perovskite in the light-emitting device based on the material of perovskite is resolved, and thereby prolonging the lifetime of the light-emitting device.

BRIEF DESCRIPTION OF DRAWINGS

In order to more clearly explain the technical solutions in the embodiments of the present disclosure, the accompanying drawings used in the description of the embodiments are introduced simply below. It is obvious that the accompanying drawings in the following description are merely a part of the embodiments of the present disclosure. A person having ordinary skill in this field can also obtain other accompanying drawings according to the accompanying drawings under the premise of not paying creative works.

DETAILED DESCRIPTION OF EMBODIMENTS

In conjunction with accompanying drawings and embodiments, the present disclosure will be further described in detail below. It is particularly pointed out that the following embodiments are merely used to explain the present disclosure without limiting the scope of the present disclosure. Also, the following embodiments are a part of the embodiments of the present disclosure instead of all of the embodiments. A person having ordinary skill in this field can obtain other embodiments under the premise of not paying creative works, and all of these embodiments should be within the protective scope of the present disclosure.

Under a conventional current driving mode, because a light-emitting material in a light-emitting device has been in a bias electric field with a direction, there exists a problem that, a material of perovskite in a light-emitting layer is resolved, in the light-emitting device based on the material of perovskite, thereby causing the light-emitting device to generally have a short lifetime. In order to solve the above technical problem, the technical solution of the present disclosure provides a light-emitting device in order to avoid that the light-emitting material in the light-emitting device has been in the bias electric field with a direction and further avoid that the material of perovskite in the light-emitting device based on the material of perovskite is resolved, thereby prolonging the lifetime of the light-emitting device.

Figure 1:
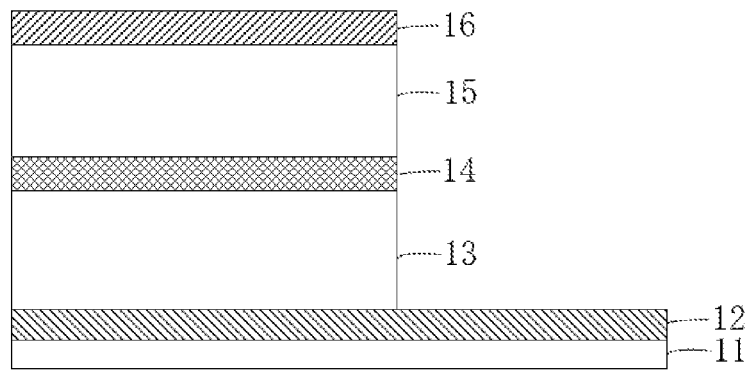
FIG. 1 is a schematic structural diagram of a light-emitting device according to an embodiment of the present disclosure.

Please refer to FIG. 1, which is a schematic structural diagram of a light-emitting device according to an embodiment of the present disclosure. As shown in FIG. 1, a light-emitting device 10 includes a substrate 11, and a first electrode 12, a first light-emitting unit 13, a connecting layer 14, a second light-emitting unit 15, and a second electrode 16 stacked up sequentially on the substrate 11. In the present embodiment, polarities of the first electrode 12 and the second electrode 16 are opposite and reverse periodically in order that the first light-emitting unit 13 and the second light-emitting unit 15 illuminate alternately.

A material of the substrate 11 can be glass or a hard resin, and can also be an organic polymer such as polyimide, polycarbonate, polyethylene terephthalate, a polyethersulfone substrate, and so on. Materials of the first electrode 12 and the second electrode 16 can be materials with low resistivity, such as silver, alloy of magnesium and silver, gold, copper, platinum, indium tin oxide, indium zinc oxide, and so on. The materials of the first electrode 12 and the second electrode 16 can be identical or different.

Figure 2:
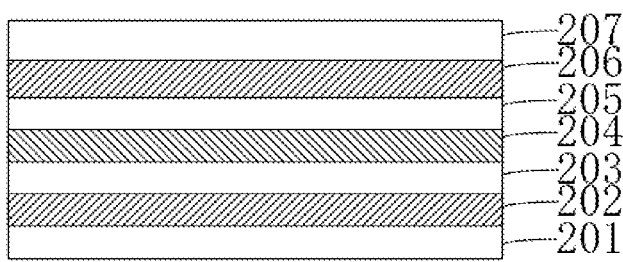
FIG. 2 is a schematic structural diagram of a first structure according to an embodiment of the present disclosure.
Figure 3:
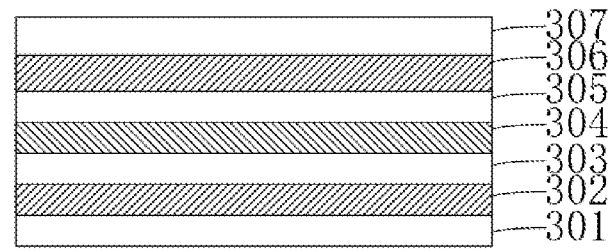
FIG. 3 is a schematic structural diagram of a second structure according to an embodiment of the present disclosure.

In the present embodiment, structures of the first light-emitting unit 13 and the second light-emitting unit 15 are different, so that their directions of current are different while being in an illuminating state. Specifically, one of the first light-emitting unit 13 and the second light-emitting unit 15 is of a first structure, and the other one of the first light-emitting unit 13 and the second light-emitting unit 15 is of a second structure. As shown in FIG. 2 and FIG. 3, the first structure 200 can include a hole injection layer 201, a hole transport layer 202, an electron blocking layer 203, a light-emitting layer 204, a hole blocking layer 205, an electron transport layer 206, and an electron injection layer 207 stacked up from bottom to top, and the second structure 300 can include an electron injection layer 301, an electron transport layer 302, a hole blocking layer 303, a light-emitting layer 304, an electron blocking layer 305, a hole transport layer 306, and a hole injection layer 307 stacked up from bottom to top.

While a light-emitting unit with the first structure 200 is in the illuminating state, a direction of current in the light-emitting unit is from bottom to top. While a light-emitting unit with the second structure 300 is in the illuminating state, a direction of current in the light-emitting unit is from top to bottom.

It needs to be explained that, in some embodiments, the first structure 200 and the second structure 300 can include only a part of hole injection layers 201 and 307, hole transport layers 202 and 306, electron blocking layers 203 and 305, light-emitting layers 204 and 304, hole blocking layers 205 and 303, electron transport layers 206 and 302, and electron injection layers 207 and 301. For example, the first structure 200 can include only the hole injection layer 201, the hole transport layer 202, the light-emitting layer 204, and the electron transport layer 206 stacked up from bottom to top. The second structure 300 can include only the electron injection layer 301, the electron transport layer 302, the light-emitting layer 304, the hole transport layer 306, and the hole injection layer 307 stacked up from bottom to top.

Figure 4:
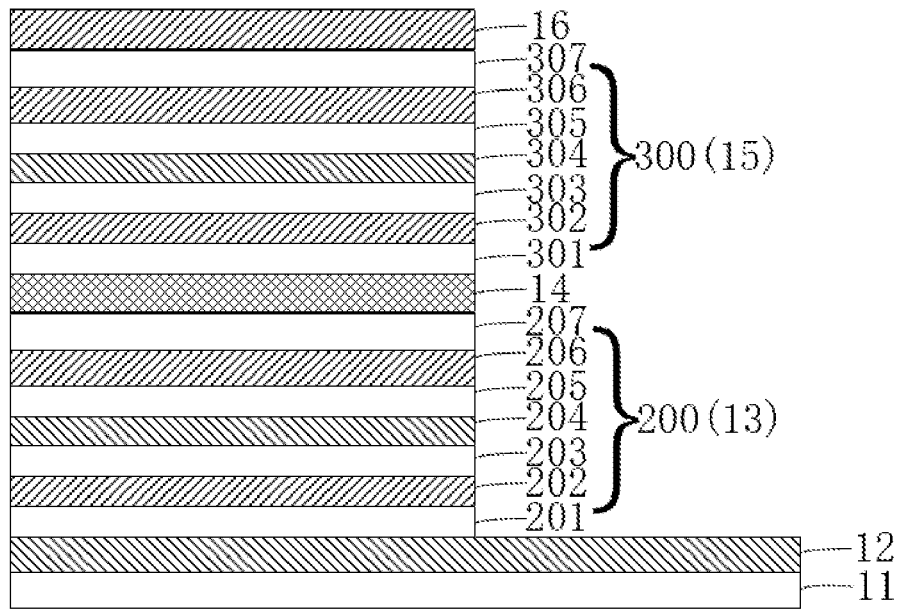
FIG. 4 is another schematic structural diagram of the light-emitting device according to an embodiment of the present disclosure.

In an embodiment, as shown in FIG. 4, the connecting layer 14 can include at least one material selected from a group consisting of Li, Rb, Cs, Mg, and Ag when the first light-emitting unit 13 is of the first structure 200 and when the second light-emitting unit 15 is of the second structure 300. For example, the connecting layer 14 can be a Li layer, a Rb layer, a Cs layer, an Mg layer, or an Ag layer, and can also be an electron transporting material layer doped with at least one material selected from a group consisting of Li, Rb, Cs, Mg, and Ag.

Specifically, when the polarity of the first electrode 12 is positive and when the polarity of the second electrode 16 is negative, the first light-emitting unit 13 illuminates, and the second light-emitting unit 15 does not illuminate. When the polarity of the first electrode 12 is negative and when the polarity of the second electrode 16 is positive, the first light-emitting unit 13 does not illuminate, and the second light-emitting unit 15 illuminates.

Figure 5:
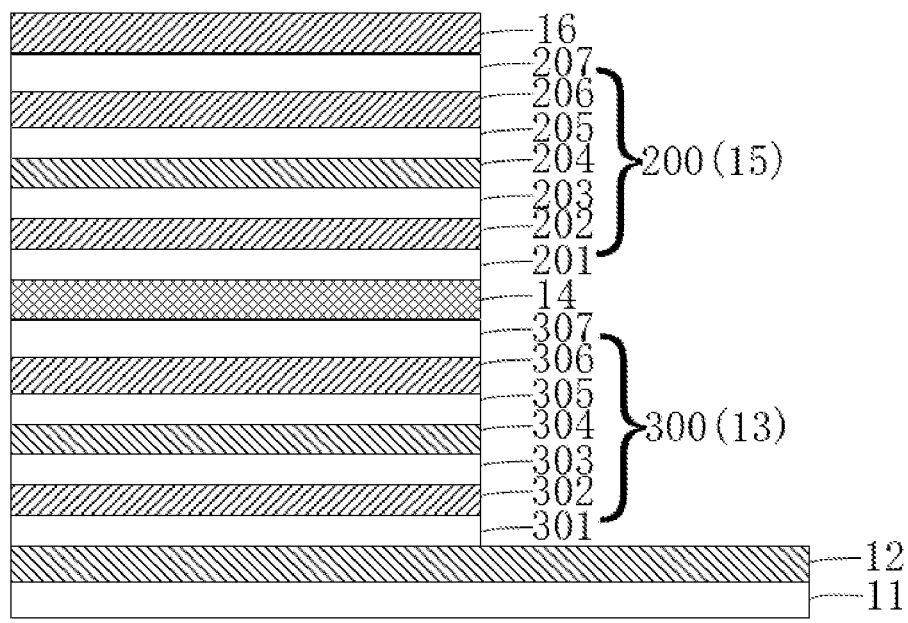
FIG. 5 is another schematic structural diagram of the light-emitting device according to an embodiment of the present disclosure.

In a substitute embodiment, as shown in FIG. 5, the connecting layer 14 can include at least one material selected from a group consisting of $FeCl_3$, $F_4$-TCNQ, $WO_3$, $MoO_3$, and HAT-CN when the first light-emitting unit 13 is of the second structure 300 and when the second light-emitting unit 15 is of the first structure 200. For example, the connecting layer 14 can be an $FeCl_3$ layer, an $F_4$-TCNQ layer, a $WO_3$ layer, an $MoO_3$ layer, or an HAT-CN layer, and can also be a hole transporting material layer doped with at least one material selected from a group consisting of $FeCl_3$, $F_4$-TCNQ, $WO_3$, $MoO_3$, and HAT-CN.

Specifically, when the polarity of the first electrode 12 is positive and when the polarity of the second electrode 16 is negative, the first light-emitting unit 13 does not illuminate, and the second light-emitting unit 15 illuminates. When the polarity of the first electrode 12 is negative and when the polarity of the second electrode 16 is positive, the first light-emitting unit 13 illuminates, and the second light-emitting unit 15 does not illuminate.

In some embodiments, the connecting layer 14 can further be of a laminated structure.

For example, please continue to refer to FIG. 4, the above laminated structure can include a first negative doped layer (not shown), a first positive doped layer (not shown), and a second negative doped layer (not shown) stacked up from bottom to top when the first light-emitting unit 13 is of the first structure 200 and when the second light-emitting unit 15 is of the second structure 300. The laminated structure can also include two negative doped layers stacked up and a hole transporting material layer without dope, located between the two negative doped layers.

For example, please continue to refer to FIG. 5, the above laminated structure can include a second positive doped layer (not shown), a third negative doped layer (not shown), and a third positive doped layer (not shown) stacked up from bottom to top when the first light-emitting unit 13 is of the second structure 300 and when the second light-emitting unit 15 is of the first structure 200. The laminated structure can also include two positive doped layers stacked up and an electron transporting material layer without dope, located between the two positive doped layers.

Materials of the first, second, and third positive doped layers can include a hole transporting material doped with positive dope including at least one material selected from a group consisting of $FeCl_3$, $F_4$-TCNQ, $WO_3$, $MoO_3$, and HAT-CN. Materials of the first, second, and third negative doped layers can include an electron transporting material doped with negative dope including at least one material selected from a group consisting of Li, Rb, Cs, Ag, and related compounds.

In the above embodiment, materials of the light-emitting layers 204 and 304 can include perovskite. Specifically, the molecular formula of perovskite can be simplified as $ABO_3$, where A can be cations, such as $Cs^+$, $CH_3NH_3^+$, $C_6H_5C_2H_4NH_3^+$, $HC(NH_2)_2^+$, etc., B can be $Pb^{3+}$, $Bi^{3+}$, $Sn^{3+}$, etc., and 0 can be anions, such as $Cl^-$, $Br^-$, $I^-$, etc.

Under the conventional current driving mode, the polarities of the first electrode 12 and the second electrode 16 remain constant and unchanged. If the first electrode 12 is an anode, the second electrode 16 is a negative electrode. Also, when the light-emitting device 10 is in an illuminating state, the voltage inputted to the first electrode 12 has been greater than the voltage inputted to the second electrode 16. That is, the material of perovskite in the light-emitting layers 204 and 304 has been in the bias electric field with a direction, causing cations with positive charge in perovskite to move along the direction of the bias electric field and causing anions with negative charge to move along the opposite direction of the bias electric field. Thus, with increasing working time of the light-emitting device 10, even more of perovskite is resolved, further causing the light-emitting device 10 to fail.

In the present embodiment, the polarities of the first electrode 12 and the second electrode 16 reverse periodically in order to switch the direction of the bias electric field in the light-emitting device 10, further causing the material of perovskite not to have been in the bias electric field with a direction and causing the cations and the anions of perovskite to move back and forth due to direction switching of the bias electric field, so that the risk that the material of perovskite in the light-emitting layers 204 and 304 is resolved is significantly reduced.

Switching frequencies of the polarities of the first electrode 12 and the second electrode 16 can be determined according to practical performance of the light-emitting device 10. For example, it can be determined according to brightness, sparks, and other conditions of the light-emitting device 10 with different switching frequencies in order that a spark phenomenon does not occur in the light-emitting device 10 while the light-emitting device 10 is displaying. In an embodiment, the switching frequencies of the polarities of the first electrode 12 and the second electrode 16 can be 60 Hz.

In the above embodiment, the connecting layer 14 can generate pairs of hole electrons when the first light-emitting unit 13 and the second light-emitting unit 15 illuminate alternately in order to timely provide the first light-emitting unit 13 and the second light-emitting unit 15 with electrons or holes, and keep the first light-emitting unit 13 and the second light-emitting unit 15 illuminate normally.

To ensure that the light-emitting device 10 has higher quantum efficiency, a thickness of the light-emitting device 10 can be not greater than 300 nm, and a thickness of the connecting layer 14 can be between 5 and 100 nm.

Compared with conventional technologies, in the present embodiment, the light-emitting device includes the substrate, and the first electrode, the first light-emitting unit, the connecting layer, the second light-emitting unit, and the second electrode stacked up sequentially on the substrate, wherein the polarities of the first electrode and the second electrode are opposite and reverse periodically in order that the first light-emitting unit and the second light-emitting unit illuminate alternately, avoiding that a light-emitting material in the light-emitting device has been in a bias electric field with a direction, further avoiding that a material of perovskite in the light-emitting device based on the material of perovskite is resolved, and thereby prolonging the lifetime of the light-emitting device.

Figure 6:
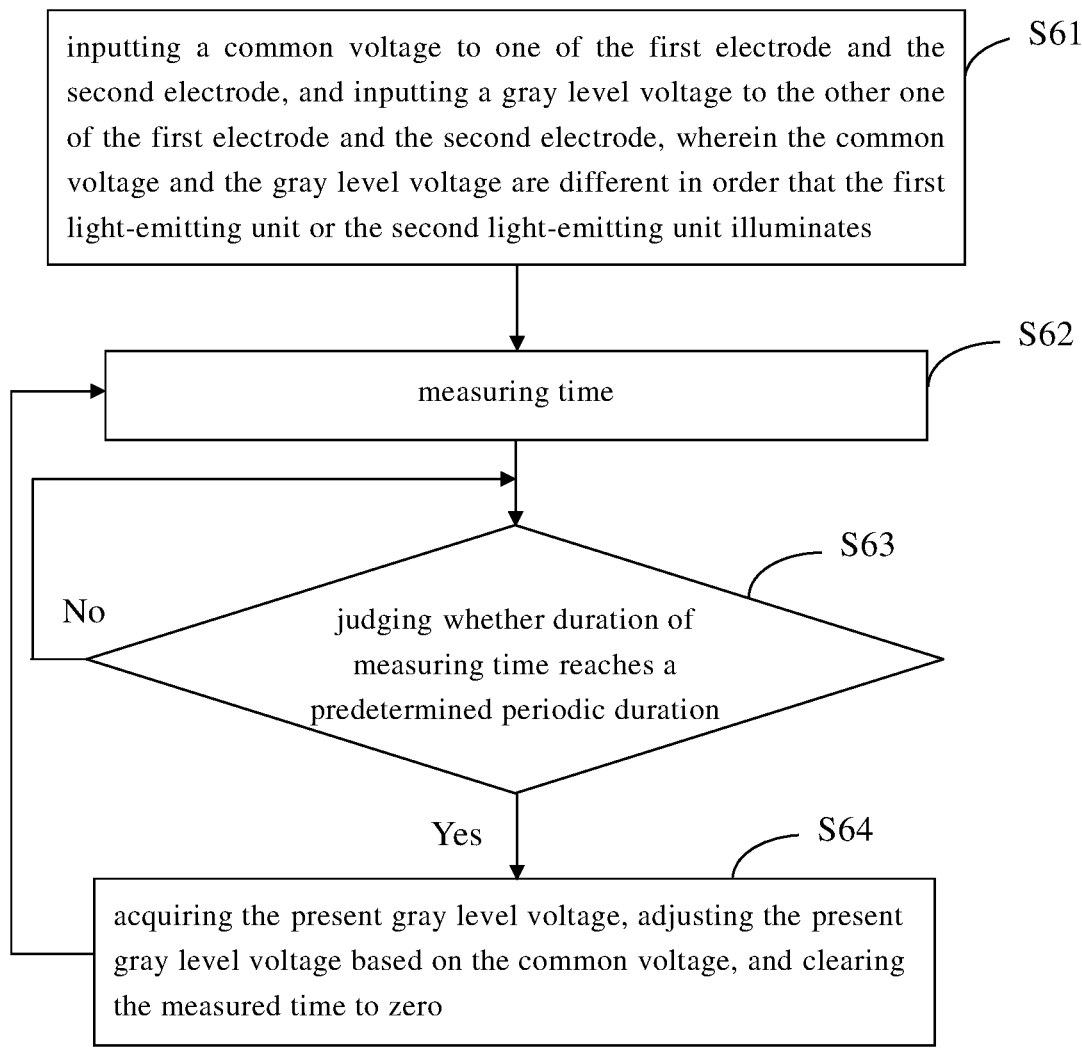
FIG. 6 is a flowchart of a method of driving the light-emitting device according to an embodiment of the present disclosure.

Please refer to FIG. 6, which is a flowchart of a method of driving the light-emitting device according to an embodiment of the present disclosure. The method of driving the light-emitting device, applied in the light-emitting device in any of the above embodiments, includes the following steps:

Step S61: inputting a common voltage to one of the first electrode and the second electrode, and inputting a gray level voltage to the other one of the first electrode and the second electrode, wherein the common voltage and the gray level voltage are different in order that the first light-emitting unit or the second light-emitting unit illuminates.

In the present embodiment, the light-emitting device includes the substrate, and the first electrode, the first light-emitting unit, the connecting layer, the second light-emitting unit, and the second electrode stacked up sequentially on the substrate.

If the common voltage is greater than the gray level voltage, the polarity of the electrode to which the common voltage is inputted is positive, and the polarity of the electrode to which the gray level voltage is inputted is negative. In this way, when the first light-emitting unit is of the first structure, when the second light-emitting unit is of the second structure, when the common voltage is inputted to the first electrode, and when the gray level voltage is inputted to the second electrode, the first light-emitting unit illuminates, and the second light-emitting unit does not illuminate. Alternatively, when the first light-emitting unit is of the second structure, when the second light-emitting unit is of the first structure, when the common voltage is inputted to the first electrode, and when the gray level voltage is inputted to the second electrode, the first light-emitting unit does not illuminate, and the second light-emitting unit illuminates.

If the common voltage is less than the gray level voltage, the polarity of the electrode to which the common voltage is inputted is negative, and the polarity of the electrode to which the gray level voltage is inputted is positive. In this way, when the first light-emitting unit is of the first structure, when the second light-emitting unit is of the second structure, when the common voltage is inputted to the first electrode, and when the gray level voltage is inputted to the second electrode, the first light-emitting unit does not illuminate, and the second light-emitting unit illuminates. Alternatively, when the first light-emitting unit is of the second structure, when the second light-emitting unit is of the first structure, when the common voltage is inputted to the first electrode, and when the gray level voltage is inputted to the second electrode, the first light-emitting unit illuminates, and the second light-emitting unit does not illuminate.

Step S62: measuring time.

Specifically, measuring time immediately after inputting the common voltage to one of the first electrode and the second electrode and inputting the gray level voltage to the other one of the first electrode and the second electrode.

Step S63: judging whether duration of measuring time reaches a predetermined periodic duration, and if the duration of measuring time does, executing step S64, or executing step S63 again.

The predetermined periodic duration can be determined according to practical performance of the light-emitting device. For example, it can be determined according to brightness, sparks, and other conditions of the light-emitting device in a different periodic duration in order that a spark phenomenon does not occur in the light-emitting device while the light-emitting device is displaying.

In an embodiment, the predetermined periodic duration can be 1/60 second.

Step S64: acquiring the present gray level voltage, adjusting the present gray level voltage based on the common voltage, and returning to step S62 after clearing the measured time to zero in order that the first light-emitting unit and the second light-emitting unit illuminate alternately.

In the present embodiment, adjusting the present gray level voltage based on the common voltage every predetermined periodic duration in order that the polarities of the first electrode and the second electrode reverse, and the first light-emitting unit and the second light-emitting unit illuminate alternately.

Specifically, step S64 can include the following steps:

Sub-step A: acquiring the present gray level voltage.

When the duration of measuring time reaches the predetermined periodic duration, the present gray level voltage can be acquired from a driving integrated circuit (IC).

Sub-step B: acquiring a difference value by computing the difference between the present gray level voltage and the common voltage.

For example, if the present gray level voltage is 2.8 volts and if the common voltage is 0 volt, the difference value can be computed to be 2.8 volts by subtracting the common voltage from the present gray level voltage.

Sub-step C: acquiring a target gray level voltage by computing the difference between the common voltage and the difference value.

Following the previous example, the target gray level voltage is computed to be −2.8 volts by subtracting 2.8 volts from 0 volt.

Sub-step D: adjusting the present gray level voltage to the target gray level voltage, and clearing the measured time to zero.

Following the previous example, adjusting the present gray level voltage (i.e., 2.8 volts) to the target gray level voltage (i.e., −2.8 volts), that is, the present gray level voltage inputted to the first electrode or the second electrode is −2.8 volts.

Specifically, when the common voltage is greater than the gray level voltage, the difference between the present gray level voltage and the common voltage is a negative value, the present gray level voltage is adjusted to the difference between the common voltage and the negative value. That is, under the premise of not changing the difference value between the gray level voltage and the common voltage, the gray level voltage is increased, and the increased gray level voltage is greater than the common voltage, so that the polarities of the first electrode and the second electrode reverse.

Correspondingly, when the common voltage is less than the gray level voltage, the difference between the present gray level voltage and the common voltage is a positive value, the present gray level voltage is adjusted to the difference between the common voltage and the positive value. That is, under the premise of not changing the difference value between the gray level voltage and the common voltage, the gray level voltage is decreased, and the decreased gray level voltage is less than the common voltage, so that the polarities of the first electrode and the second electrode reverse.

In some substitute embodiments, the above step S64 can be replaced as follows:

Exchanging input voltages of the first electrode and the second electrode, and returning to step S62 after clearing the measured time to zero in order that the first light-emitting unit and the second light-emitting unit illuminate alternately.

Specifically, judging whether the input voltage of the first electrode is the common voltage, and if so, inputting the gray level voltage to the first electrode and inputting the common voltage to the second electrode, or inputting the common voltage to the first electrode and inputting the gray level voltage to the second electrode.

In this way, exchanging the input voltages of the first electrode and the second electrode every predetermined periodic duration in order that the polarities of the first electrode and the second electrode reverse, and the first light-emitting unit and the second light-emitting unit illuminate alternately.

Compared with conventional technologies, the present embodiment provides the method of driving the light-emitting device through periodically reversing the polarities of the first electrode and the second electrode in order that the first light-emitting unit and the second light-emitting unit illuminate alternately, avoiding that a light-emitting material in the light-emitting device has been in a bias electric field with a direction, further avoiding that a material of perovskite in the light-emitting device based on the material of perovskite is resolved, and thereby prolonging the lifetime of the light-emitting device.

Figure 7:
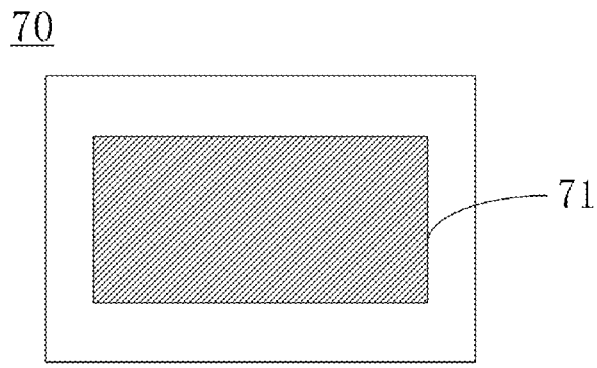
FIG. 7 is a schematic structural diagram of a display panel according to an embodiment of the present disclosure.

Please refer to FIG. 7, which is a schematic structural diagram of a display panel according to an embodiment of the present disclosure. The display panel 70 includes a light-emitting device 71 in any of the above embodiments.

Specifically, the light-emitting device 71 includes a substrate, and a first electrode, a first light-emitting unit, a connecting layer, a second light-emitting unit, and a second electrode stacked up sequentially on the substrate. Polarities of the first electrode and the second electrode are opposite and reverse periodically in order that the first light-emitting unit and the second light-emitting unit illuminate alternately.

Compared with conventional technologies, in the present embodiment, the display panel includes the substrate, and the first electrode, the first light-emitting unit, the connecting layer, the second light-emitting unit, and the second electrode stacked up sequentially on the substrate, wherein the polarities of the first electrode and the second electrode are opposite and reverse periodically in order that the first light-emitting unit and the second light-emitting unit illuminate alternately, avoiding that a light-emitting material in the light-emitting device has been in a bias electric field with a direction, further avoiding that a material of perovskite in the light-emitting device based on the material of perovskite is resolved, and thereby prolonging the lifetime of the light-emitting device.

The embodiments described above are merely preferred embodiments of the present disclosure without limitation. Any of modifications, equivalent replacements, and improvements based on the spirit and the principles of the present disclosure should be included in the protective scope thereof.

What is claimed is:

1. A light-emitting device, comprising: a substrate, and a first electrode, a first light-emitting unit, a connecting layer, a second light-emitting unit, and a second electrode stacked up sequentially on the substrate;
   wherein polarities of the first electrode and the second electrode are opposite and reverse periodically in order that the first light-emitting unit and the second light-emitting unit illuminate alternately;
   wherein one of the first light-emitting unit and the second light-emitting unit is of a first structure comprising a hole injection layer, a hole transport layer, an electron blocking layer, a light-emitting layer, a hole blocking layer, an electron transport layer, and an electron injection layer stacked up from bottom to top, and wherein the other one of the first light-emitting unit and the second light-emitting unit is of a second structure comprising the electron injection layer, the electron transport layer, the hole blocking layer, the light-emitting layer, the electron blocking layer, the hole transport layer, and the hole injection layer stacked up from bottom to top;
   wherein the connecting layer is of a laminated structure, wherein the laminated structure comprises a first negative doped layer, a first positive doped layer, and a second negative doped layer stacked up from bottom to top when the first light-emitting unit is of the first structure and when the second light-emitting unit is of the second structure, and wherein the laminated structure comprises a second positive doped layer, a third negative doped layer, and a third positive doped layer stacked up from bottom to top when the first light-emitting unit is of the second structure and when the second light-emitting unit is of the first structure.

2. The light-emitting device of claim 1, wherein the connecting layer comprises at least one material selected from a group consisting of Li, Rb, Cs, Mg, and Ag when the first light-emitting unit is of the first structure and when the second light-emitting unit is of the second structure.

3. The light-emitting device of claim 1, wherein the connecting layer comprises at least one material selected from a group consisting of $FeCl_3$, $F_4$-TCNQ, $WO_3$, $MoO_3$, and HAT-CN when the first light-emitting unit is of the second structure and when the second light-emitting unit is of the first structure.

4. The light-emitting device of claim 1, wherein materials of the first, second, and third positive doped layers comprise a hole transporting material doped with positive dope comprising at least one material selected from a group consisting of $FeCl_3$, $F_4$-TCNQ, $WO_3$, $MoO_3$, and HAT-CN, and wherein materials of the first, second, and third negative doped layers comprise an electron transporting material doped with negative dope comprising at least one material selected from a group consisting of Li, Rb, Cs, Mg, and Ag.

5. The light-emitting device of claim 1, wherein a material of the light-emitting layer comprises perovskite.

6. The light-emitting device of claim 1, wherein a thickness of the connecting layer is between 5 and 100 nm.

7. The light-emitting device of claim 1, wherein switching frequencies of the polarities of the first electrode and the second electrode are 60 Hz.

8. A method of driving a light-emitting device comprising a substrate, and a first electrode, a first light-emitting unit, a connecting layer, a second light-emitting unit, and a second electrode stacked up sequentially on the substrate, the method comprising:
   inputting a common voltage to one of the first electrode and the second electrode, and inputting a gray level voltage to the other one of the first electrode and the second electrode, wherein the common voltage and the gray level voltage are different in order that the first light-emitting unit or the second light-emitting unit illuminates; and
   measuring time and judging whether duration of measuring time reaches a predetermined periodic duration, and if the duration of measuring time does, acquiring the present gray level voltage, adjusting the present gray level voltage based on the common voltage, and returning to the step of measuring time after clearing the measured time to zero in order that the first light-emitting unit and the second light-emitting unit illuminate alternately.

9. The method of claim 8, wherein the step of adjusting the present gray level voltage based on the common voltage comprises:
   acquiring a difference value by computing the difference between the present gray level voltage and the common voltage;
   acquiring a target gray level voltage by computing the difference between the common voltage and the difference value; and
   adjusting the present gray level voltage to the target gray level voltage.

10. A display panel, comprising: a light-emitting device comprising a substrate, and a first electrode, a first light-emitting unit, a connecting layer, a second light-emitting unit, and a second electrode stacked up sequentially on the substrate;
   wherein polarities of the first electrode and the second electrode are opposite and reverse periodically in order that the first light-emitting unit and the second light-emitting unit illuminate alternately;
   wherein one of the first light-emitting unit and the second light-emitting unit is of a first structure comprising a hole injection layer, a hole transport layer, an electron blocking layer, a light-emitting layer, a hole blocking layer, an electron transport layer, and an electron injection layer stacked up from bottom to top, and wherein the other one of the first light-emitting unit and the second light-emitting unit is of a second structure comprising the electron injection layer, the electron transport layer, the hole blocking layer, the light-emitting layer, the electron blocking layer, the hole transport layer, and the hole injection layer stacked up from bottom to top;
   wherein the connecting layer is of a laminated structure, wherein the laminated structure comprises a first negative doped layer, a first positive doped layer, and a second negative doped layer stacked up from bottom to top when the first light-emitting unit is of the first structure and when the second light-emitting unit is of the second structure, and wherein the laminated structure comprises a second positive doped layer, a third negative doped layer, and a third positive doped layer stacked up from bottom to top when the first light-emitting unit is of the second structure and when the second light-emitting unit is of the first structure.

11. The display panel of claim 10, wherein the connecting layer comprises at least one material selected from a group consisting of Li, Rb, Cs, Mg, and Ag when the first light-emitting unit is of the first structure and when the second light-emitting unit is of the second structure.

12. The display panel of claim 10, wherein the connecting layer comprises at least one material selected from a group consisting of $FeCl_3$, $F_4$-TCNQ, $WO_3$, $MoO_3$, and HAT-CN when the first light-emitting unit is of the second structure and when the second light-emitting unit is of the first structure.

13. The display panel of claim 10, wherein materials of the first, second, and third positive doped layers comprise a hole transporting material doped with positive dope comprising at least one material selected from a group consisting of $FeCl_3$, $F_4$-TCNQ, $WO_3$, $MoO_3$, and HAT-CN, and wherein materials of the first, second, and third negative doped layers comprise an electron transporting material doped with negative dope comprising at least one material selected from a group consisting of Li, Rb, Cs, Mg, and Ag.

14. The display panel of claim 10, wherein a material of the light-emitting layer comprises perovskite.

15. The display panel of claim 10, wherein a thickness of the connecting layer is between 5 and 100 nm.

16. The display panel of claim 10, wherein switching frequencies of the polarities of the first electrode and the second electrode are 60 Hz.

* * * * *